United States Patent [19]

Souza et al.

[11] Patent Number: 5,233,299
[45] Date of Patent: Aug. 3, 1993

[54] PROJECTION METHODS FOR PRODUCING TWO-DIMENSIONAL IMAGES FROM THREE-DIMENSIONAL DATA

[75] Inventors: Steven P. Souza, Williamstown, Mass.; William J. Adams, Clifton Park; Charles L. Dumoulin, Ballston Lake, both of N.Y.

[73] Assignee: General Electric Company, Schenectady, N.Y.

[21] Appl. No.: 674,476

[22] Filed: Mar. 25, 1991

[51] Int. Cl.$^5$ .............................................. G01V 3/00
[52] U.S. Cl. ..................................... 324/307; 382/41
[58] Field of Search ............... 324/300, 307, 309, 312; 382/41, 50, 51, 52, 54

[56] References Cited

U.S. PATENT DOCUMENTS

| | | | |
|---|---|---|---|
| 4,431,968 | 2/1984 | Edelstein et al. | 324/309 |
| 4,731,863 | 3/1988 | Sezan et al. | 382/51 |
| 4,908,573 | 3/1990 | Kaufman et al. | 324/309 |
| 4,984,160 | 1/1991 | Saint Felix et al. | 364/413.19 |
| 5,113,137 | 5/1992 | Koizumi et al. | 324/307 |

FOREIGN PATENT DOCUMENTS

| | | |
|---|---|---|
| 0366387 | 5/1990 | European Pat. Off. |
| 0148584 | 7/1986 | Japan ..................................... 382/51 |

OTHER PUBLICATIONS

Magnetic Resonance in Medicine, vol. 14, No. 2, pp. 222-229, May 1990, "Displays for MR Angiography", by G. Laub.

Magnetic Resonance in Medicine, vol. 11, No. 1, pp. 35-46, Jul. 1989, "Three-Dimensional Time-of-Flight Magnetic Resonance Angiography Using Spin Saturation", by C. L. Dumoulin, et al.

Magnetic Resonance in Medicine, vol. 9, pp. 139-149, 1989, "Three-Dimensional Phase Contrast Angiography", by C. L. Dumoulin, et al.

9th International Conference on Pattern Recognition, vol. 2, Nov. 1988, Rome, Italy, pp. 689-692; "Automated Threshold Detection Using a Pyramid Structure", by T. Jiang, et al.

Dumoulin, C. L.; Souza, S. P.; Walker, M. F.; Wagle, W., "Three-Dimensional Phase Contrast Agniography," Magnetic Resonance in Medicine, vol. 9, p. 139, 1989.

Amartur, Sundar C.; Masaryk, Thomas J.; Modic, Michael T.; et al., "3DFT Time-of-Flight Magnetic Resonance Angiography," Dynamic Cardiovascular Imaging, vol. 2, No. 3, p. 170, 1989.

Flannery, W. H.; Teukolsky, S. A., et al., Numerical Recipies, AC Press, Cambridge University Press, Chapt. 13, p. 454, 1986.

G. Laub, "Displays for MR Angiography," Magnetic Resonance in Medicine, vol. 14, pp. 222-229, Jun. 1990.

Souza, Steven P., Adams, William J. and Dumoulin, Charles L., "Improved 3D MR Angiography by Statistical Projection," 9th Annual Meeting of the Society of Magnetic Resonance (Abstract and Posters for Presentation), Oct. 1990.

Primary Examiner—Louis Arana
Attorney, Agent, or Firm—Lawrence P. Zale; Marvin Snyder

[57] ABSTRACT

A method of collecting three-dimensional magnetic resonance (MR) fluid flow images from a volume of a subject and constructing a high contrast low noise two-dimensional image therefrom is accomplished by statistical calculation of voxel values along projection lines cast through a three-dimensional data volume obtained from three-dimensional MR angiography techniques, and converting the data to projection images by summing the weighted differences from the projection average of data for each voxel along a projection ray. The data are then normalized and repeated for all projection rays to obtain a set of projection values which are displayed on a two-dimensional display device.

7 Claims, 6 Drawing Sheets

PROJECTION METHODS FOR PRODUCING TWO-DIMENSIONAL IMAGES FROM THREE-DIMENSIONAL DATA

BACKGROUND OF THE INVENTION

1. Field of the Invention

This invention relates generally to Magnetic Resonance Angiography signal processing and more specifically to a method of reducing three-dimensional Magnetic Resonance Angiography or stationary tissue data to a two-dimensional image using statistical manipulation, while reducing noise and/or increasing contrast.

2. Description of Related Art

Known techniques for magnetic resonance angiography include methods that, either by volume or sequential-slice acquisition, produce data sets with spatial resolution in three dimensions. These techniques may utilize either time-of-flight effects or motion-induced phase shifts to produce flow contrast. Since there is at this time no practical real-time three-dimensional display technology (e.g., holographic video) available, this data is reduced to two spatial dimensions for convenient viewing by the radiologist. This has generally been accomplished by generating a series of projection images at sequential view angles. These images are then repeatedly displayed in rapid sequence on a display screen to give the viewer a three-dimensional impression of the vascular anatomy. The projection images are created by ray tracing through the volume of data, using some predetermined method for calculating the projected pixel value from each ray. In the case of phase contrast data, it is desirable to preserve the quantitative nature of the data insofar as is possible.

The most obvious projection method is to take the mean of all volume pixel ("voxel") values along each cast ray. This unfortunately yields images with low vessel contrast and poor detection of fine features and vessels, especially for time-of-flight data that always contain signals from unsuppressed stationary tissue. This is because vessels are sparse within the data volume and the total noise and/or background signal along a ray can easily be comparable to or much larger than the total flow signal along that ray. To provide good vessel contrast, the method of choice has become projection of the largest voxel value along each ray. (See Dumoulin, C. L., Souza, S. P., Walker, M. F., and Wagle, W., "Three-dimensional phase contrast angiography," Magn. Reson. Med., (1989), and Armatur, S. C., Masaryk, T. J., Modic, M. T.: et al., "3DFT time-of-flight magnetic resonance angiography," *Dynamic Cardiovascular Imaging*, 2. 170, 1989). This method is generally known as Maximum Intensity Projection (MIP). The MIP method uses the maximum voxel value along a projection ray and discards the remaining voxel values along that ray. Since along each ray which actually intercepts one or more vessels the only voxel which contributes to the projected pixel is within a vessel, the contrast is very good. Unfortunately MIP has several drawbacks. Since the MIP method retains only one voxel along each ray, it does not make efficient use of the acquired data. This is especially true where a vessel extends over many voxels and averaging over the vessel might be employed to improve the vessel signal-to-noise ratio. The MIP method tends to lose contrast for vessels with strong signal near the walls but weak signal near the axis of the vessel. This situation occurs in phase contrast MR angiography when the velocity at the center of the vessel exceeds the maximum for which the applied flow encoding produces monotonically increasing signal. The MIP method also may obscure real pathological features. For example, this will occur when a stenotic lesion distorts a vessel wall and the lesion appears along the line-of sight rather than displayed in profile. There is a need for a projection method that retains the maximum amount of information possible when transforming the acquired data to projection data while introducing no artifactual features and discarding few actual features.

OBJECTS OF INVENTION

It is an object of the present invention to construct a high-contrast low-noise two-dimensional image from three-dimensional magnetic resonance (MR) fluid flow data from a volume of a subject.

It is another object of the present invention to alter the contrast between structures of a subject imaged to make differing structures more visible.

It is another object of the present invention to adapt the MR data to reduce differing types of noise inherent in the MR data.

It is another object of the present invention to construct projection images from three-dimensional MR stationary tissue data, thereby producing synthetic images similar to conventional x-ray images but with alterable contrast between structures.

SUMMARY OF THE INVENTION

In this invention, three-dimensional Magnetic Resonance fluid flow or stationary tissue measurements of a volume of a subject are processed into high-contrast low-noise two-dimensional images. The first step is to acquire by known means a three-dimensional data set having a number of entries, each entry corresponding to a Magnetic Resonance fluid flow or stationary tissue volume element, or volume pixel (voxel) value of said subject. The value of each pixel in the final two-dimensional image is a calculated statistic of the array of voxel values intercepted by an imaginary ray cast through the three-dimensional data along the line of sight to that particular pixel at some view angle. An order of the statistic is chosen which depends on the general shape of a histogram of the data that is to be imaged. A projection ray is passed at a predetermined angle through the data volume and the three-dimensional data set entries corresponding to all intersected voxels are chosen. The average and standard deviations of this set of entries are taken.

The projection average is subtracted from each of the entries and the result is then raised to a power being equal to that of a statistical order, to obtain the weighted voxel differences.

The sum of the weighted voxel differences is divided by the number of entries, then divided by a normalization constant to result in a projection value. This procedure is repeated for all parallel rays covering the three-dimensional data set and intersecting all pixels in the projection image, and the data set is then displayed as a two-dimensional fluid flow image.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings(s) in which:

DETAILED DESCRIPTION OF THE PREFERRED EMBODIMENT

U.S. Pat. Nos. 4,431,968 Edelstein et al. issued Feb. 14, 1984, and 4,796,635 Dumoulin issued Jan. 10, 1989 and assigned to the instant assignee are hereby incorporated by reference and made part of this application.

Figure 1:
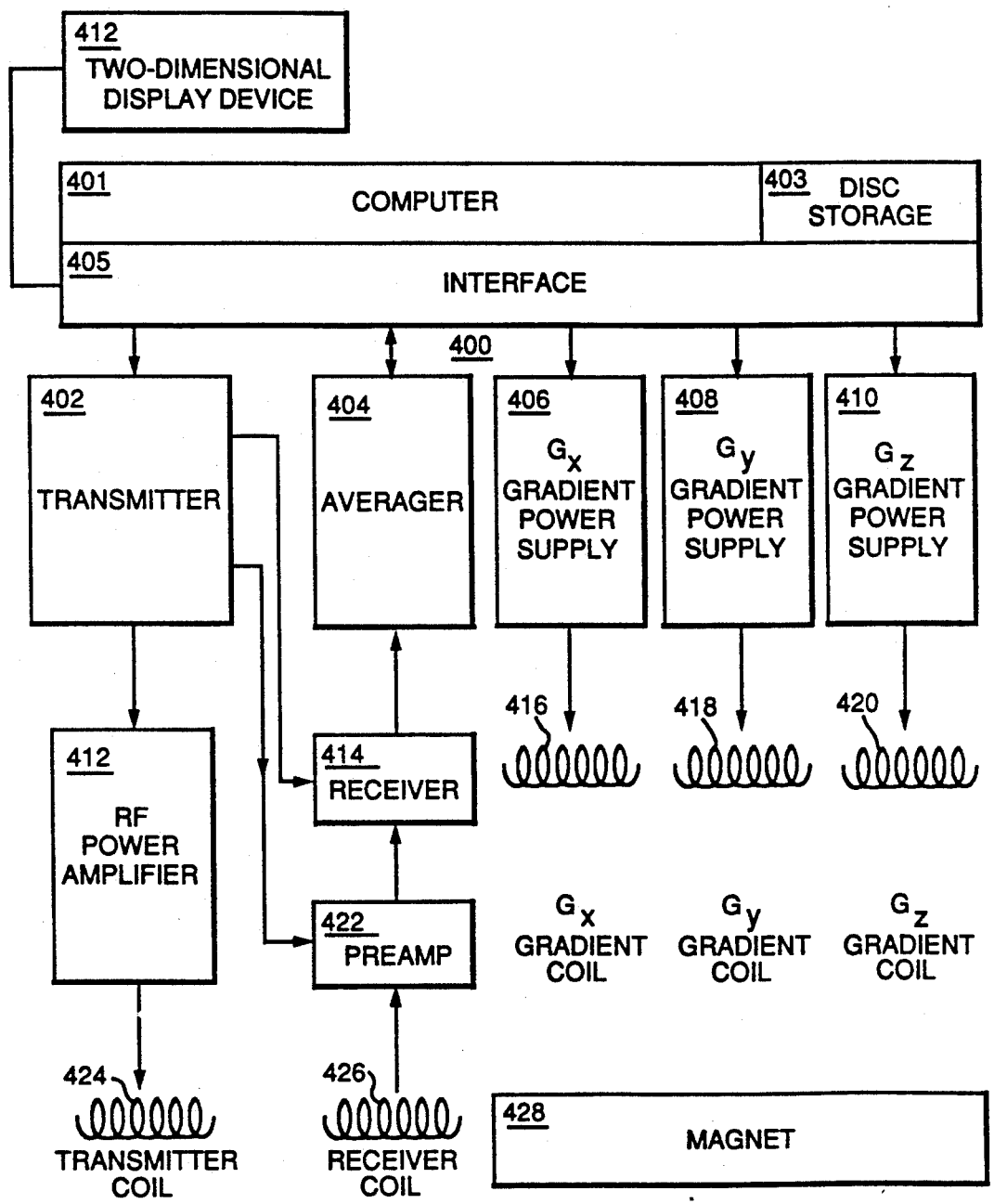
FIG. 1 is a block diagram showing the apparatus of the present invention that is used for obtaining the three-dimensional MR data, and constructing a two-dimensional projection image.

Apparatus such as that shown in FIG. 1 is used to create three-dimensional magnetic resonance images of fluid flow or stationary tissue in a subject. Magnet 428 immerses the subject to be imaged in a static magnetic field. Computer 401 sends gradient power pulses via interface 405 to gradient power supplies 406, 408, and 410. Gradient power supply 406 energizes gradient coil 416. The the time-changing current passing through gradient coil 416 induces a time-changing magnetic field having a gradient in the x direction. Similarly, current passing through coils 418 and 420 produce magnetic fields having gradients in the y and z directions respectively.

Computer 401 sends RF excitation pulse information to transmitter 402 via interface 405. Transmitter 402 creates an RF pulse of a predetermined strength, duration, and frequency that is amplified via RF power amplifier 412. The RF pulse is transmitted by transmitter coil 424 to the subject. The combination of the RF pulse, the static magnetic field, and the magnetic field gradients causes magnetic resonance of nuclei of the subject that can be localized.

Figure 2:
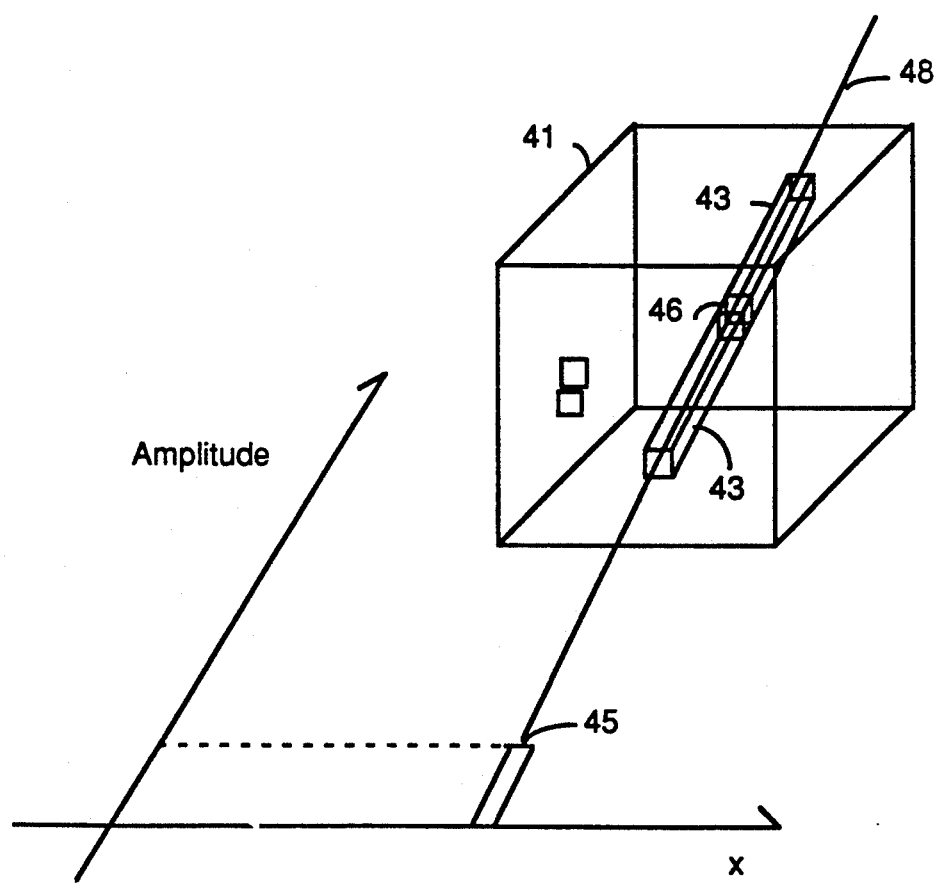
FIG. 2 is a graphical representation of the geometry employed by the present invention, showing a three-dimensional data set volume, a projection ray, and a weighted projection value pertaining to the projection ray.

The signals received from the subject are received by a receiver coil 426, then processed by a preamplifier 422, receiver 414, and averager 404. The signal is then sent through an interface 405 to disk storage 403. The entire set of signals is received and stored. The signals are reconstructed by computer 401 into a three-dimensional data set volume 41 as shown in FIG. 2. This three-dimensional data set volume 41 is composed of voxels, each corresponding to fluid flow approximately as it occurs in the original volume 54 of FIG. 3.

After reconstructing the three-dimensional data set 41, computer 401 represents portions of the data on two-dimensional display device 430, via interface 405. The display device may be a printer, plotter, color-coded color monitor, or gray scale monitor.

For a more detailed description of operation of the apparatus shown in FIG. 1, see U.S. Pat. No. 4,431,968.

To display an image on a two-dimensional screen, a set of projection amplitudes 45 of FIG. 2 must be taken of the three-dimensional data set volume 41. Casting projection rays 48 through the entire three-dimensional data set volume 41 produces a set of projection amplitudes 45. Each projection amplitude 45 is created by processing a plurality 43 of data set entries 46, each representing a corresponding voxel volume of the subject, along projection ray 48.

The prior art would simply average all data set entries 46 along projection ray 48 to obtain the projection amplitude 45 pertaining to that projection ray 48.

Another method, the Maximum Intensity Projection (MIP) method, is applied by simply taking the value of the voxel along projection ray 48 having the highest amplitude and using this value as the projection amplitude 45 of projection ray 48.

Figure 3:
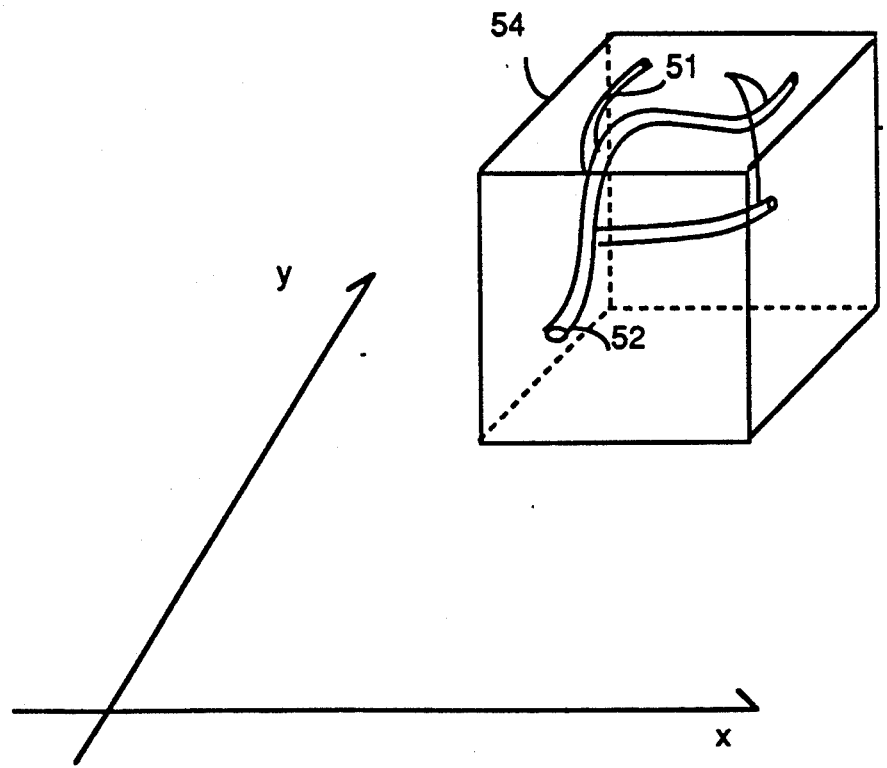
FIG. 3 shows a volume of the subject to be imaged that corresponds to the data set volume shown in FIG. 2.

The present invention employs a method of statistical calculation of data set entries 46 along projection ray 48 permitting an adjustable tradeoff between increased contrast (i.e., between small vessels 51 and background signal as shown in FIG. 3), and an increased signal to noise ratio. This statistical method employs an adjustment parameter k, the order of the statistic, which is adjusted to image differing types of data.

Figure 4:
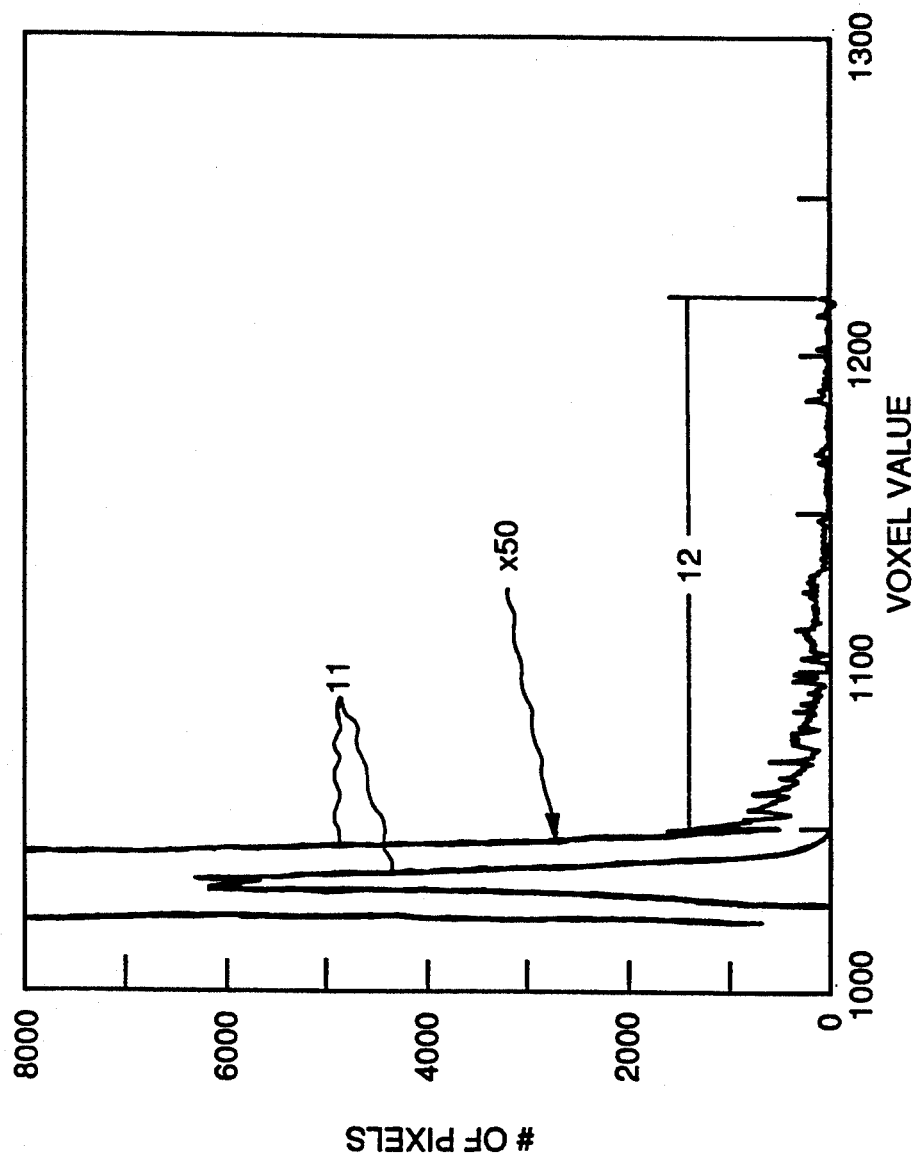
FIG. 4 is a histogram of the three-dimensional MR data obtained by a typical phase contrast fluid flow image shown in normal amplification and 50 times amplification.
Figure 5:
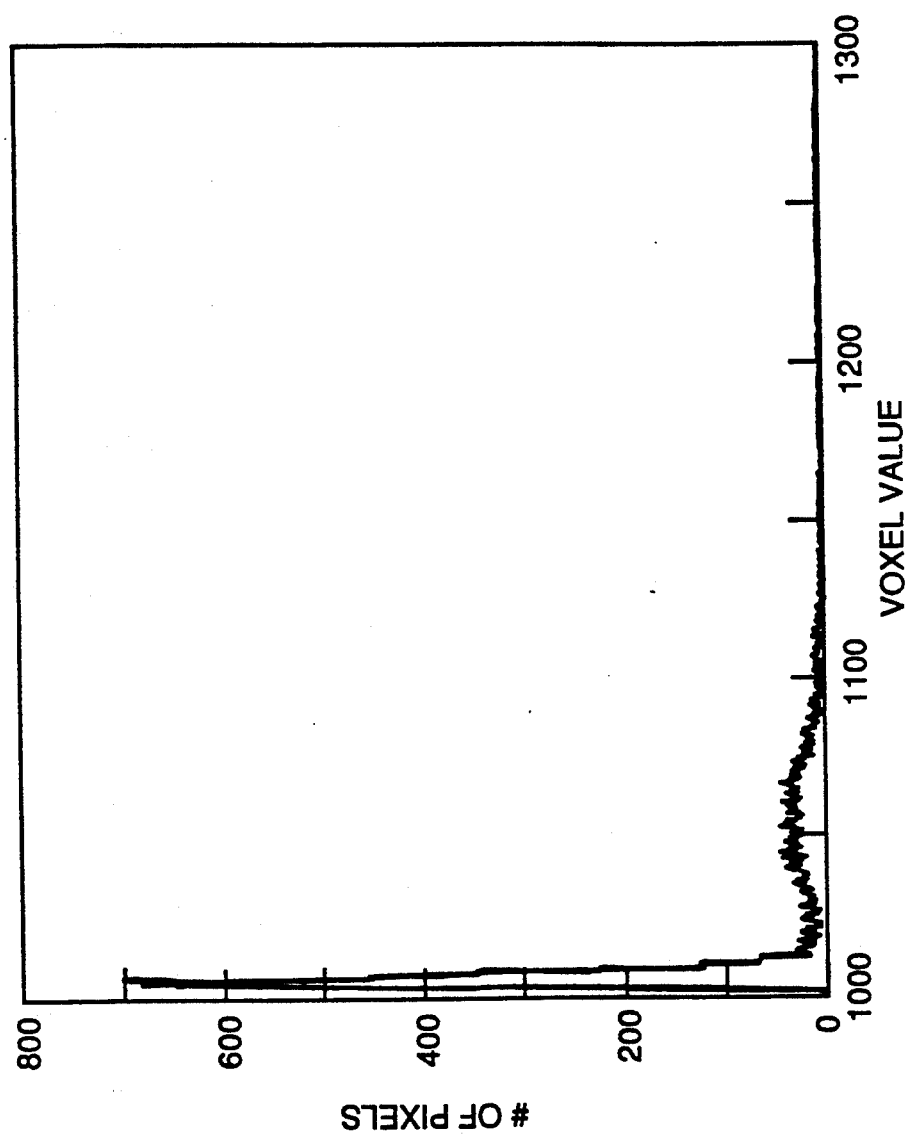
FIG. 5 a histogram of a typical "time-of-flight" fluid flow image.

Consider a histogram of the voxel values in a three-dimensional MR angiogram, as shown in FIG. 4 for phase contrast data and FIG. 5 for time-of-flight data, in each case for one set of rays from a three-dimensional data set. In the case of phase contrast data there are at least two components to the distribution: a large, symmetrical, nearly Gaussian peak 11 at low voxel values representing noise, and a tail 12 extending toward high voxel values representing true vessel information (possibly with a contribution from faint ghosts of the vessels). The noise in peak 11 dominates the mean of this distribution (its lowest-order statistic), with only a small contribution from voxel values 12.

The MIP method takes the maximum voxel value ($V_{max}$) along projection ray 48 of FIG. 2. This single voxel value $V_{max}$ is chosen, and all other voxel values are discarded.

The present invention uses an approach that is different from either of the above methods. The present invention uses intermediate-order statistics representative of the distribution of voxel values along each projection (e.g., 48 of FIG. 2). Standard deviation (or its related measure variance), skewness, kurtosis, etc. are defined by:

$$\frac{1}{N \sigma^{k-1}} \sum_{i=1}^{N} (V - V_i)^k$$

where N is the number of samples, V is the mean of the distribution, k is the order of the statistic, $\sigma$ is the standard deviation of the distribution and $V_i$ is an individual voxel value intersected by projection ray 48 of FIG. 2. The resulting values are normalized to provide the same units as $V_i$. In addition, k=2 corresponds to standard deviation, that is a measure of the width of a distribution, k=3 corresponds to skewness (a measure of the asymmetry of a distribution), and k=4 corresponds to kurtosis (a measure of the flatness or peakedness of a distribution). Higher orders of k may be defined, as well as non-integral orders (e.g., k=2.7). The MIP method is roughly equivalent to k=infinity.

Each of these statistical measures will indeed detect vessels and other structures, but the best measure is highly data-dependent. In the distribution shown in FIG. 4, skewness is likely to be the best measure since the high voxel values 12 contribute to the asymmetry of the distribution but the low value (or noise) voxel values 11 do not. Using skewness rather than the MIP method for the data set yields projection images with improved contrast and signal-to-noise ratios for larger vessels without loss of fine detail.

In general, lower-order statistics, i.e., lower k values, yield higher signal-to-noise ratios, better rendition of extended structures such as medium-to-large vessels, and better sensitivity to features along the projection ray 48 of FIG. 2. They also better preserve the quantitative nature of phase contrast data. Higher-order statistics yield better contrast against noise or stationary-tissue background and better sensitivity to small (e.g., single-voxel) features occurring at the right hand side, the tail 12 of FIG. 4. As a general rule, one should use the lowest-order statistic that provides sufficient contrast and background suppression. For phase contrast data the best statistic is likely to be standard deviation or skewness. For time-of-flight data a higher-order statistic is generally better.

Figure 6:
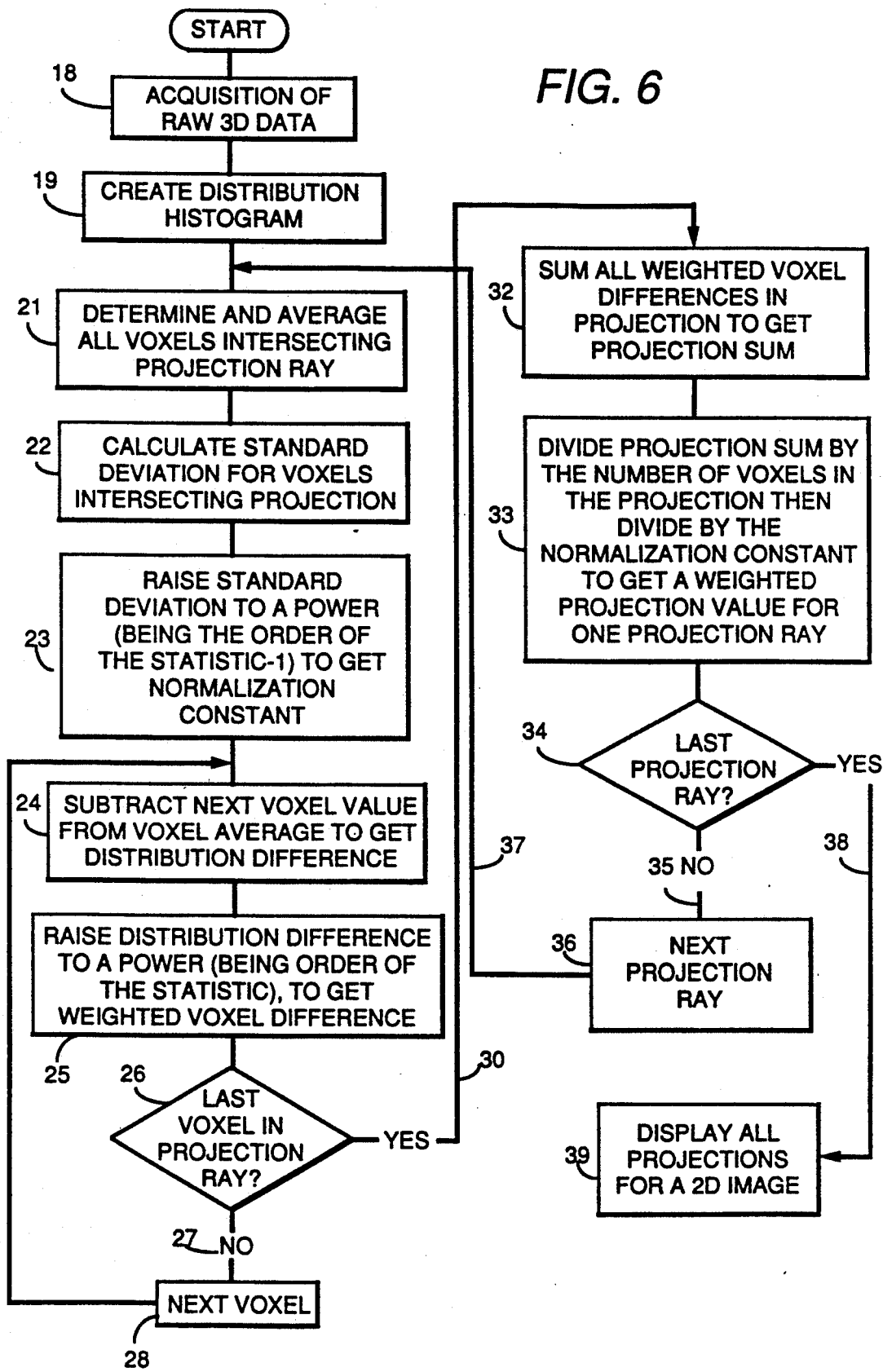
FIG. 6 is a flow chart illustrating use of the present invention.

An example of how the present invention is to be applied is shown in FIG. 6. Data is acquired in step 18 by employing a three-dimensional flow-sensitive MR imaging technique. The apparatus of FIG. 1 is employed to collect this data and perform the computations.

The characteristics of the distribution histogram of the data, similar to FIG. 4 or 5, are constructed in step 19. The order of the statistic is determined, which reflects the shape of the data in the histogram. (e.g., if the data to be imaged adds to the skewness of the histogram, the order of the statistic should be "3".)

The set of data set entries 43, which intersect a ray 48 of FIG. 2, is determined. An average set 43 is taken in step 21 of FIG. 5. In step 22 the standard deviation of the voxels intersecting ray 48 of FIG. 2 is determined, except in the case k=2. The standard deviation obtained is raised to a power equal to the order of the statistic minus one to obtain the normalization constant at step 23. Each voxel value $V_i$ is subtracted from the voxel average to create a distribution difference in step 24.

The distribution difference is raised to a power equal to the order of the statistic, to obtain a weighted voxel difference in step 25.

It is then determined in step 26 if the voxel value that was processed was the last voxel intersecting ray 48 of FIG. 2. If it was not, processing continues along path 27, and the next voxel along the projection ray 48 of FIG. 2 is chosen in step 28. Steps 24 and 25 are then repeated for voxels intersecting this projection ray.

If the voxel processed at step 25 was the last voxel intersecting ray 48 of FIG. 2, processing passes along path 30 to step 32. The weighted voxel differences for voxels intersecting ray 48 of FIG. 2 are summed in step 32 to obtain a projection sum. The projection sum is divided by the number of voxels intersecting ray 48 of FIG. 2, then (except in the case of k=2), divided by the normalization constant in step 33 to obtain a weighted projection value for projection rays 45 and 48 of FIG. 2. (For k=2 proper normalization at step 33 is obtained by taking the square root of the projection sum divided by the number of voxels intersecting ray 48 of FIG. 2).

In step 34 it is determined if the projection ray processed is the last projection ray. If it is not the last projection ray, the next projection ray is chosen in step 36, and processing returns to step 21 to repeat the processing for the new projection ray. Processing continues as described above until all parallel projections through three-dimensional data set volume 41 (FIG. 2) are processed. The two-dimensional array of projection values is then a numerical representation of the projection image.

When all the projections have been processed, the processing continues along path 38. The projections are then transferred to an electronic two-dimensional display device (430 of FIG. 1) and are displayed in step 39 by computer 401 through the interface 405 to display device 430 of FIG. 1 device for viewing and interpretation.

The methods described herein will be useful in obtaining high quality projection angiograms from three-dimensional MR flow data. These methods result in high-contrast low-noise two-dimensional images from collecting three-dimensional magnetic resonance (MR) fluid flow data from a volume of a subject.

These methods are also useful when applied to MR stationary tissue data to produce projection images similar to conventional x-ray images, but with contrast between structures that can be altered by varying the order of the statistic k. Further, these methods are not limited to data obtained by magnetic resonance methods, but may be applied to any three-dimensional image data.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What we claim is:

1. A method of displaying a two-dimensional (2D) projection image of desired structures of a subject from collected three-dimensional (3D) image data of a volume of a subject comprising the steps of:
   a) acquiring a 3D data set having a plurality of entries, each entry being a value corresponding to at least one physical parameter representative of a voxel within said volume;
   b) selecting a statistical order k;
   c) choosing a viewing angle from which to view said volume;
   d) determining a set of intersected voxels which are intersected by a selected imaginary projection ray passing through said volume at the viewing angle and determining N intersected data set entries $V_i$ corresponding to the intersected voxels;
   e) calculating an average V and a standard deviation $\sigma$ from the N intersected data set entries $V_i$;
   f) calculating a projection value $P_k$ from the N intersected data set entries $V_i$ according to the equation:

$$P_k = \frac{1}{N\sigma^{k-1}} \sum^{N} (V - V_i)^k$$

g) repeating steps "d"-"f" for a plurality of parallel imaginary projection rays at the viewing angle covering said volume;

h) transferring the projection values $P_k$ to a two-dimensional display device;

i) displaying a two-dimensional image created from the projection values $P_k$ on the two dimensional display device for analysis and interpretation;

j) increase the value of the statistical order k and repeat steps "d"-"i" if a greater contrast of said structures in the projection image is desired; and k) decrease the value of the statistical order k and repeat steps "d"-"i" if a greater signal-to-noise ratio of said structures in the projection image is desired.

2. The method of displaying a 2D projection image as recited in claim 1 wherein the 3D data set is acquired by phase contrast magnetic resonance imaging techniques.

3. The method of displaying a 2D projection image as recited in claim 1 wherein the 3D data set is acquired by time-of-flight magnetic resonance flow imaging techniques.

4. The method of displaying a 2D projection image as recited in claim 1 further including the step of varying the order of the statistic for a predetermined three-dimensional data set to produce images with differing contrast of said structures of said subject imaged.

5. The method of displaying a 2D projection image as recited in claim 1 wherein the 3D data set is acquired by magnetic resonance imaging techniques used to produce images of substantially stationary tissue.

6. The method of displaying a 2D projection image as recited in claim 1 wherein the 3D data set is acquired by tomographic imaging techniques.

7. The method of displaying a 2D projection image as recited in claim 1 wherein the 3D data set is acquired by magnetic resonance imaging techniques.

* * * * *